United States Patent
Park

(10) Patent No.: US 9,501,978 B2
(45) Date of Patent: Nov. 22, 2016

(54) ORGANIC LIGHT EMITTING DISPLAY DEVICE, DRIVING METHOD THEREOF, AND MANUFACTURING METHOD THEREOF

(71) Applicant: Samsung Display Co., Ltd., Yongin, Gyeonggi-Do (KR)

(72) Inventor: Dong-Wook Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 206 days.

(21) Appl. No.: 14/270,947

(22) Filed: May 6, 2014

(65) Prior Publication Data

US 2014/0232762 A1    Aug. 21, 2014

Related U.S. Application Data

(62) Division of application No. 13/179,423, filed on Jul. 8, 2011, now Pat. No. 8,717,259.

(30) Foreign Application Priority Data

Dec. 28, 2010  (KR) .................. 10-2010-0137059

(51) Int. Cl.
*H01L 51/56* (2006.01)
*H01L 51/52* (2006.01)
*G09G 3/32* (2016.01)
*H01L 27/32* (2006.01)

(52) U.S. Cl.
CPC .......... *G09G 3/3283* (2013.01); *G09G 3/3225* (2013.01); *G09G 3/3233* (2013.01); *H01L 27/3262* (2013.01); *H01L 27/3265* (2013.01); *G09G 2300/0819* (2013.01); *G09G 2300/0861* (2013.01); *G09G 2300/0866* (2013.01)

(58) Field of Classification Search
CPC  H01L 27/3262; H01L 27/3265; H01L 51/56
See application file for complete search history.

(56) References Cited

U.S. PATENT DOCUMENTS

| 5,929,449 | A | 7/1999 | Huang |
|---|---|---|---|
| 6,373,453 | B1 | 4/2002 | Yudasaka |
| 6,501,227 | B1 | 12/2002 | Koyama |
| 7,414,600 | B2 | 8/2008 | Nathan et al. |
| 2003/0189535 | A1 | 10/2003 | Matsumoto |

(Continued)

FOREIGN PATENT DOCUMENTS

| KR | 10-2006-0124028 A | 12/2006 |
|---|---|---|
| KR | 10-2007-0112714 A | 11/2007 |

(Continued)

*Primary Examiner* — Mariceli Santiago
(74) *Attorney, Agent, or Firm* — Knobbe, Martens, Olson & Bear, LLP

(57) ABSTRACT

An organic light emitting diode (OLED) display with improved long range uniformity, driving method and manufacturing method are disclosed. The OLED display manufacturing method includes forming a first active pattern on a substrate, a gate insulating layer, a gate electrode overlapping at least a part of the first active pattern on the gate insulating layer and an interlayer insulating layer. The OLED display manufacturing method further includes forming a conductive layer pattern and an anode of an OLED, forming a pixel defining layer and forming the OLED by forming an organic emission layer and a cathode. The conductive layer pattern is formed to cover the gate electrode and contact a first power line on the interlayer insulating layer.

4 Claims, 8 Drawing Sheets

(56) References Cited

U.S. PATENT DOCUMENTS

| | | |
|---|---|---|
| 2004/0012548 A1 | 1/2004 | Anzai |
| 2004/0129933 A1 | 7/2004 | Nathan et al. |
| 2004/0130516 A1 | 7/2004 | Nathan et al. |
| 2004/0227707 A1 | 11/2004 | Inukai |
| 2006/0256248 A1 | 11/2006 | Baek et al. |
| 2007/0046593 A1 | 3/2007 | Shin |
| 2007/0273619 A1 | 11/2007 | Kitazawa et al. |
| 2009/0009673 A1 | 1/2009 | Hisada |
| 2009/0015166 A1 | 1/2009 | Kwon |
| 2010/0078647 A1* | 4/2010 | Eom .................. H01L 27/1285 257/72 |
| 2010/0110050 A1 | 5/2010 | Park et al. |
| 2011/0069058 A1 | 3/2011 | Chung et al. |
| 2011/0128211 A1* | 6/2011 | Ono .................... H01L 27/3265 345/76 |
| 2011/0134381 A1* | 6/2011 | Park .................. G02F 1/136213 349/139 |
| 2011/0298785 A1 | 12/2011 | Al-Dahle et al. |
| 2012/0001156 A1* | 1/2012 | Cho .................... H01L 27/1248 257/40 |
| 2012/0306939 A1 | 12/2012 | Choi et al. |
| 2013/0048953 A1 | 2/2013 | Song et al. |

FOREIGN PATENT DOCUMENTS

| | | |
|---|---|---|
| KR | 10-2008-0058036 A | 6/2008 |
| KR | 10-2009-0093020 A | 9/2009 |

* cited by examiner

ORGANIC LIGHT EMITTING DISPLAY DEVICE, DRIVING METHOD THEREOF, AND MANUFACTURING METHOD THEREOF

CROSS-REFERENCE TO RELATED APPLICATION

This application is a divisional of U.S. patent application Ser. No. 13/179,423, filed Jul. 8, 2011, which claims the benefit of Korean Patent Application No. 10-2010-0137059, filed on Dec. 28, 2010, in the Korean Intellectual Property Office, the disclosures of which are incorporated herein by reference in their entireties. Any and all applications for which a foreign or domestic priority claim is identified in the Application Data Sheet as filed with the present application are hereby incorporated by reference under 37 CFR 1.57.

BACKGROUND

Field

The disclosed technology relates to a display device, a driving method thereof, and a manufacturing method thereof. More particularly, the disclosed technology relates to an organic light emitting diode (OLED) display with excellent long range display uniformity, a driving method thereof, and a manufacturing method thereof.

Description of the Related Technology

An organic light emitting diode (OLED) display has a self-emission characteristic so a separate light source is not required, and it has high quality characteristics such as low power consumption, high luminance, and high speed such that it is considered a next generation display device. Also, OLED technology is appropriately applicable to a high-speed operational circuit since it has excellent carrier mobility. However, as OLED displays have become larger, long range display uniformity including uniformity of the overall luminance of a display device screen suffers because of coupling caused by undesired parasitic capacitance.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One inventive aspect is an organic light emitting diode (OLED) display, including an OLED, a first transistor for transmitting a data signal in response to a current scan signal, a second transistor for generating a driving current of the OLED according to the data signal, a first capacitor for storing the data signal, and a second capacitor for shielding parasitic capacitance between a gate electrode of the second transistor and a cathode of the OLED.

Another inventive aspect is a method of driving an organic light emitting diode (OLED) display. The method includes sequentially inputting data to each pixel of a pixel array, each pixel including an OLED, a first transistor for transmitting a data signal in response to a current scan signal, a second transistor for generating a driving current of the OLED according to the data signal, a first capacitor for storing the data signal, and a second capacitor for shielding parasitic capacitance between a gate electrode of the second transistor and a cathode of the OLED. The method also includes simultaneously emitting light of the respective pixels by changing power applied to the cathode.

Another inventive aspect is method for manufacturing an organic light emitting diode (OLED) display. The method includes forming a first active pattern on a substrate, forming a gate insulating layer, forming a gate electrode overlapping at least a part of the first active pattern on the gate insulating layer, forming an interlayer insulating layer, and forming a conductive layer pattern and an anode of an OLED, where the conductive layer pattern covers the gate electrode and contacts a first power line on the interlayer insulating layer. The conductive layer is a second electrode of a shield capacitor with a first electrode including the gate electrode. The method also includes forming a pixel defining layer, and forming the OLED by forming an organic emission layer and a cathode.

Another inventive aspect is an organic light emitting diode (OLED) display, including means for emitting light, means for transmitting a data signal in response to a current scan signal, means for generating a driving current of the OLED according to the data signal, means for storing the data signal, and means for shielding parasitic capacitance between a gate electrode of the second transistor and a cathode of the OLED.

DETAILED DESCRIPTION OF CERTAIN INVENTIVE EMBODIMENTS

Figure 1:
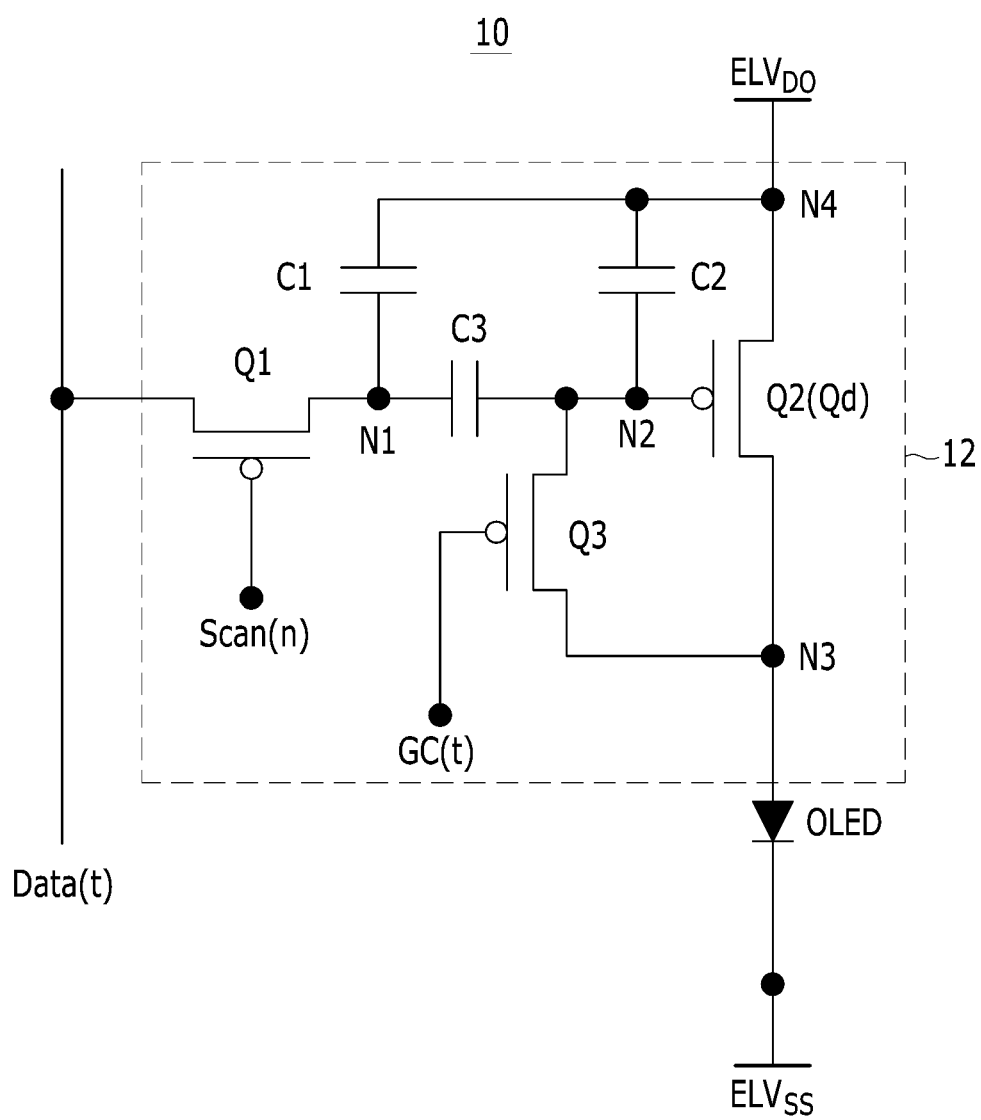
FIG. 1 shows an equivalent circuit of an organic light emitting diode (OLED) display pixel according to an exemplary embodiment.

Certain advantages and features, and methods of achieving the same, will become apparent and more readily appreciated from the following description of the embodiments in conjunction with the accompanying drawings. However, the present invention is not limited to exemplary embodiments disclosed below, and may be implemented in various forms. It will be appreciated by those skilled in the art that changes may be made to these embodiments without departing from the principles and spirit of the general inventive concept. Accordingly, in various exemplary embodiments, well-known processes, well-known elements, and well-known techniques may not be explained in detail to avoid ambiguous interpretation of the present invention.

Throughout this specification and the claims that follow, when it is described that an element is "coupled" to another element, the element may be "directly coupled" to the other element or may be "indirectly coupled" to the other element through a third element. In addition, unless explicitly described to the contrary, the word "comprise" and variations such as "comprises" or "comprising" will be understood to imply the inclusion of stated elements but not the exclusion of any other elements. The terms of a singular form may include plural forms unless referred to the contrary.

Although not specifically defined, all of the terms including the technical and scientific terms used herein have meanings understood by ordinary persons skilled in the art. The terms have specific meanings coinciding with related technical references and the present specification as well as lexical meanings. That is, the terms may not be intended to be construed as ideal or formal meanings.

Exemplary embodiments described in this specification will be explained with a layout view, a cross-sectional view, and/or a schematic diagram, which is an ideal schematic diagram. Accordingly, the exemplary views may be changed by manufacturing techniques and/or permissible errors. Further, the exemplary embodiments are not limited by the drawn specific shapes, and may include changes of the shapes that are generated according to a manufacturing process. The exemplary regions in the drawings include schematic properties, and the shapes of the exemplary regions in the drawings are to indicate the specific shapes of the regions of the elements, and not to limit the scope of the invention. Like reference numerals generally designate like elements throughout the specification.

The organic light emitting diode (OLED) display includes a shield capacitor for preventing coupling between the driving transistor and a cathode to which a voltage (ELVss) is applied. The shield capacitor may include a first electrode connected to a gate electrode of the driving transistor and a second electrode formed on the bottom part of the cathode to cover the first electrode. Therefore, when the common voltage (ELVss) changes voltages, the gate voltage of the driving transistor does not substantially change. An OLED display including a shield capacitor according to exemplary embodiments is described with reference to drawings.

FIG. 1 shows an equivalent circuit of an organic light emitting diode (OLED) display pixel according to an exemplary embodiment. Each pixel 10 includes an OLED and a pixel circuit 12 including three transistors and three capacitors (3T3C).

A gate of the first transistor Q1 is connected to a current scan signal (Scan[n]), an input terminal is connected to a data signal (Data[t]), and an output terminal is connected to a first node N1. A gate of a driving transistor (Qd), which is a second transistor Q2, is connected to a second capacitor C2 and a third capacitor C3 at a second node N2. An input terminal is connected to a first power, for example, a driving voltage (ELVdd) at a fourth node N4. An output terminal is connected to an anode of the organic light emitting diode (OLED) and an input terminal of a third transistor Q3 at a third node N3. A gate of the third transistor Q3 is connected to a global control signal (GC(t)) for compensating a threshold voltage of the driving transistor (Qd). An input terminal is connected to an output terminal of the driving transistor (Qd) at the third node N3. An output terminal is connected to a gate of the driving transistor (Qd) and the second and third capacitors C2 and C3 at the second node N2.

A first terminal of the first capacitor C1 is connected to a first terminal of the third capacitor C3 and the output terminal of the first transistor Q1 at the first node N1. A second terminal of the first capacitor C1 is connected to a first power (ELVdd) at the fourth node N4. A first terminal of the second capacitor C2 is connected to the gate of the driving transistor (Qd), the output terminal of the third transistor Q3, and a second terminal of the third capacitor C3 at the second node N2, and a second terminal to the first power (ELVdd) at the fourth node N4. A first terminal of the third capacitor C3 is connected to the output terminal of the first transistor Q1 and the first terminal of the first capacitor C1 at the first node N1. A second terminal of the third capacitor C3 is connected to the gate of the driving transistor (Qd), the output terminal of the third transistor Q3, and the first terminal of the second capacitor C2 at the second node N2.

An anode (pixel electrode) of the OLED is connected to the output terminal of the driving transistor (Qd) and the input terminal of the third transistor Q3 at the third node N3. A cathode (common electrode) of the OLED is connected to a second power, for example, the common voltage (ELVss).

The first transistor Q1 is a switching transistor for transmitting a data signal (Data[t]) with a voltage level applied to a corresponding data line in response to the current scan signal (scan[n]). The driving transistor (Qd), which is the second transistor Q2, supplies a driving current of the OLED according to the data signal (Data[t]) with the voltage level applied to the gate through the first transistor Q1. The third transistor Q3 is a threshold voltage compensating transistor for compensating a threshold voltage of the driving transistor (Qd) in response to the global control signal (GC(t)).

The first capacitor C1 stores a data signal applied to the gate of the driving transistor (Qd). The second capacitor C2 is a shield capacitor for preventing coupling caused by a parasitic capacitor that may be formed between the gate electrode of the driving transistor (Qd) and the cathode to which second power (ELVss) is applied. The third capacitor C3 controls the threshold voltage of the driving transistor (Qd).

The first to third transistors Q1, Q2, and Q3 can be p-channel field effect transistors. Thin film transistors (TFTs) can be used for the field effect transistors. The channel type of the first to third transistors Q1, Q2, and Q3 can alternatively be n-channel type, and in this case, a signal waveform for driving them may also be inverted.

FIG. 1 shows the pixel circuit 12 with the 3T3C structure, and the pixel circuit 12 can be formed with a 2T2C structure by omitting the third transistor Q3 and the third capacitor C3 when, for example, a problem of a deviation of the threshold voltage of the second transistor Q2 does not occur or it does not substantially influence the operation. In addition, to solve the deviation of the threshold voltage of the second transistor Q2, various combinations of other transistors and capacitors for substituting for the third transistor Q3 and the third capacitor C3 are applicable to the configuration of the pixel circuit.

Figure 2:
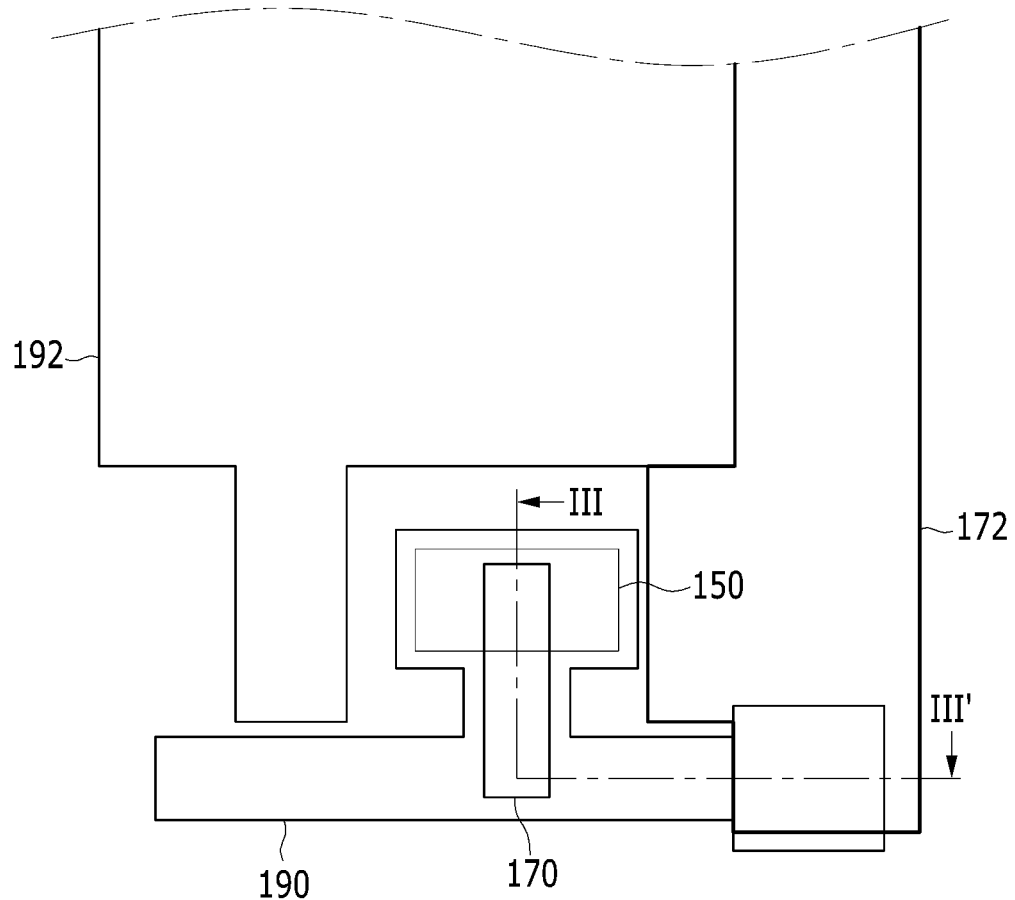
FIG. 2 shows a layout of an organic light emitting diode (OLED) display pixel according to an exemplary embodiment.
Figure 3:
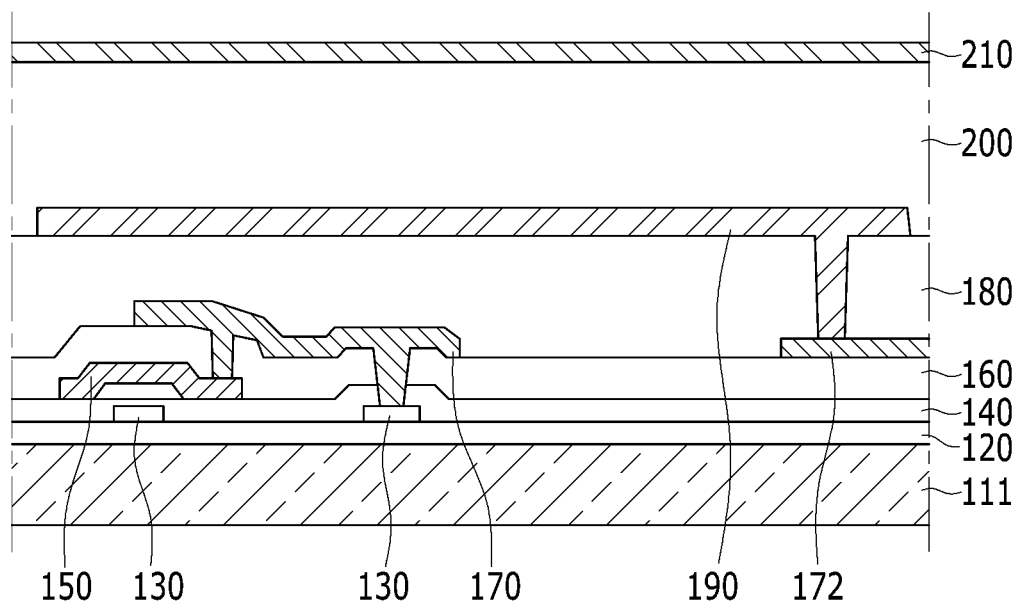
FIG. 3 shows a cross-sectional view of an organic light emitting diode (OLED) display pixel according to an exemplary embodiment.

A configuration and function of the second capacitor C2 that is a shield capacitor will now be described with reference to FIG. 2 and FIG. 3. FIG. 2 shows a part of a layout for a pixel 10 configured with the equivalent circuit shown in FIG. 1, and FIG. 3 shows a cross-sectional view thereof with respect to a line III-III' shown in FIG. 2. A layout for realizing the pixel 10 exemplified with reference to FIG. 1 is modifiable by a person of ordinary skill in the art in many ways. FIG. 2 shows a layout of elements illustrating the first electrode of the second capacitor C2, for example, a gate electrode 150 and a conductive layer pattern 170 contacting the gate electrode 150 and elements that illustrate the second electrode, for example, a first power (ELVdd) line 172 formed on the same layer as the conductive layer pattern 170 and a conductive layer pattern 190 formed on the same layer as an anode 192. An area of the anode 192 is not shown in FIG. 3.

A stacked configuration of an OLED display 100 according to an exemplary embodiment and a manufacturing method thereof will now be described with reference to FIG. 2 and FIG. 3. A substrate 111 can be a transparent insulation substrate made of glass, quartz, ceramic, or plastic. Also, the substrate 111 can be a metallic substrate made of stainless steel. Further, when the substrate 111 is made of plastic, it can be formed to be a flexible substrate.

A buffer layer 120 is formed on the substrate 111. The buffer layer 120 can be formed to be single-layered or may be multi-layered including at least one of various insulating layers known to a skilled person such as a silicon oxide (SiOx) film, a silicon nitride (SiNx) film, or a silicon oxide and nitride (SiOxNy) film by using a chemical vapor deposition method or a physical vapor deposition method. The buffer layer 120 prevents permeation of undesired elements such as impurities or moisture, and smoothes the surface. Therefore, the buffer layer 120 can be omitted depending on the type of substrate 111 and process conditions.

First and second active patterns 130 and 132 are formed on the buffer layer 120. The first and second active patterns 130 and 132 include an impurity-non-doped channel region (not shown) and p+ doped source and drain regions (not shown). In this instance, the doped ion material includes P-type impurities such as boron, gallium, or indium. The first active pattern 130 is an active pattern for the second transistor Q2, which is the driving transistor (Qd), and the second active pattern 132 is an active pattern for the third transistor Q3. An active pattern for the first transistor Q1 and a pattern for the capacitor electrode are omitted.

The PMOS type of thin film transistors using the P-type impurity are usable for the first to third transistors Q1, Q2, and Q3, but the present invention is not restricted thereto, and NMOS or CMOS types of thin film transistors are also usable. Further, the first to third transistors Q1, Q2, and Q3 can be, for example, polycrystalline thin film transistors or amorphous thin film transistors.

A gate insulating layer 140 is formed on the first and second active patterns 130 and 132. The gate insulating layer 140 can be formed by including at least one of insulating materials known to a skilled person, such as silicon nitride (SiNx), silicon oxide (SiO$_2$), or tetra ethyl ortho silicate (TEOS).

A gate electrode 150 is formed on the gate insulating layer 140. The gate electrode 150 is formed to overlap at least a part of the first active pattern 130, particularly on a channel region (not shown). The gate electrode 150 can be formed with a metal layer including at least one of various metallic materials known to a skilled person, such as molybdenum (Mo), chromium (Cr), aluminum (Al), silver (Ag), titanium (Ti), tantalum (Ta), and tungsten (W).

A first interlayer insulating layer 160 is formed on the gate electrode 150. In a like manner of the gate insulating layer 140, the first interlayer insulating layer 160 can be formed by including at least one of insulating materials known to a skilled person, such as silicon nitride (SiNx), silicon oxide (SiO$_2$), or tetra ethyl ortho silicate (TEOS). Further, the interlayer insulating layer 160 can be formed with multiple layers. For example, the first interlayer insulating layer 160 can be formed with two layers having different refractive indexes. When the two insulating layers have different refractive indexes, a glass or mirror effect can be acquired by the light reflected on their interface. For example, one layer is formed with a silicon nitride layer with a relatively high refractive index, and the other with a silicon oxide layer with a relatively low refractive index. A contact hole 165 for contacting the gate electrode 150 is formed in the interlayer insulating layer 160.

A conductive layer pattern 170 and a first power (ELVdd) line 172 are formed on the first interlayer insulating layer 160. The conductive layer pattern 170 contacts the gate electrode 150 through the contact hole 165 and is formed to connect the gate electrode 150 and the second active pattern 132. The conductive layer pattern 170 and the first power (ELVdd) line 172 can be formed with a metal layer including at least one of various metallic materials known to a skilled person, such as molybdenum (Mo), chromium (Cr), aluminum (Al), silver (Ag), titanium (Ti), tantalum (Ta), and tungsten (W).

The gate electrode 150 and the conductive layer pattern 170 contacting the gate electrode 150 form the first electrode of the second capacitor C2, which is a shield capacitor.

A second interlayer insulating layer 180 is formed on the first interlayer insulating layer 160. The second interlayer insulating layer 180 is a planarization layer for covering the conductive layer pattern 170 and the first power (ELVdd) line 172 on the first interlayer insulating layer 160 and making the surface of the substrate smooth. A contact hole for contacting the first power (ELVdd) line 172 is formed in the second interlayer insulating layer 180.

A conductive layer pattern 190 forming the second electrode of the second capacitor C2, which is a shield capacitor, and an anode 192 (shown in FIG. 2) are formed on the second interlayer insulating layer 180. The conductive layer pattern 190 forming the second electrode contacts the first power (ELVdd) line 172 through the contact hole. The conductive layer pattern 190 and the anode 192 can be formed with a reflective conductive material. Aluminum (Al), silver (Ag), magnesium (Mg), or their alloys may be used for the reflective conductive material. A reflective layer (not shown) may be further provided on the pixel electrode 192 so as to reflect much more light.

A pixel defining layer 200 is formed on the second interlayer insulating layer 180. The pixel defining layer 200 includes an opening (not shown) revealing a part of the anode 192. A part on which the pixel defining layer 200 is formed substantially becomes a non-light-emitting region, and a part in which the opening of the pixel defining layer 200 is formed substantially becomes a light emitting region. The pixel defining layer 200 can be formed with various organic or inorganic materials. For example, the pixel defining layer 200 can be made of a polyacryl-based or polyimide-based resin, and can be a layer cured by heat or light.

An organic emission layer (not shown) and a cathode 210 are formed on the anode 192 to form an OLED. The organic emission layer may be made of a low molecular weight organic material or a high molecular weight organic material, and the organic emission layer may be formed with multilayers including at least one of a hole injection layer (HIL), a hole transport layer (HTL), an electron transport layer (ETL), and an electron injection layer (EIL). The cathode 210 is formed with a transparent conductive layer. The transparent conductive layer includes at least one of indium tin oxide (ITO), indium zinc oxide (IZO), zinc indium tin oxide (ZITO), gallium indium tin oxide (GITO), indium oxide (In$_2$O$_3$), zinc oxide (ZnO), gallium indium zinc oxide (GIZO), gallium zinc oxide (GZO), fluorine tin oxide (FTO), and aluminum-doped zinc oxide (AZO).

As shown in FIG. 2 and FIG. 3, the conductive layer pattern 190 forming the second electrode of the second capacitor C2, which is a shield capacitor, is formed to completely cover the first electrodes 150 and 170 including the gate electrode 150 of the driving transistor (Qd) and the conductive layer pattern 170 contacting the gate electrode 150. Therefore, generation of parasitic capacitance between the cathode 210 and the first electrodes 150 and 170 is shielded by the conductive layer pattern 190.

The effect of the function of the shield capacitor can be maximized by applying simultaneous emission with active voltage (SEAV) driving method for controlling all organic light emitting diodes to emit light after the pixels are scanned. A driving method will now be described with reference to a signal timing diagram of FIG. 4. For clarification of description, the signal timing diagram exemplifies scan signals (Scan[1]-Scan[n]) and the second power signal (ELVss).

Figure 4:
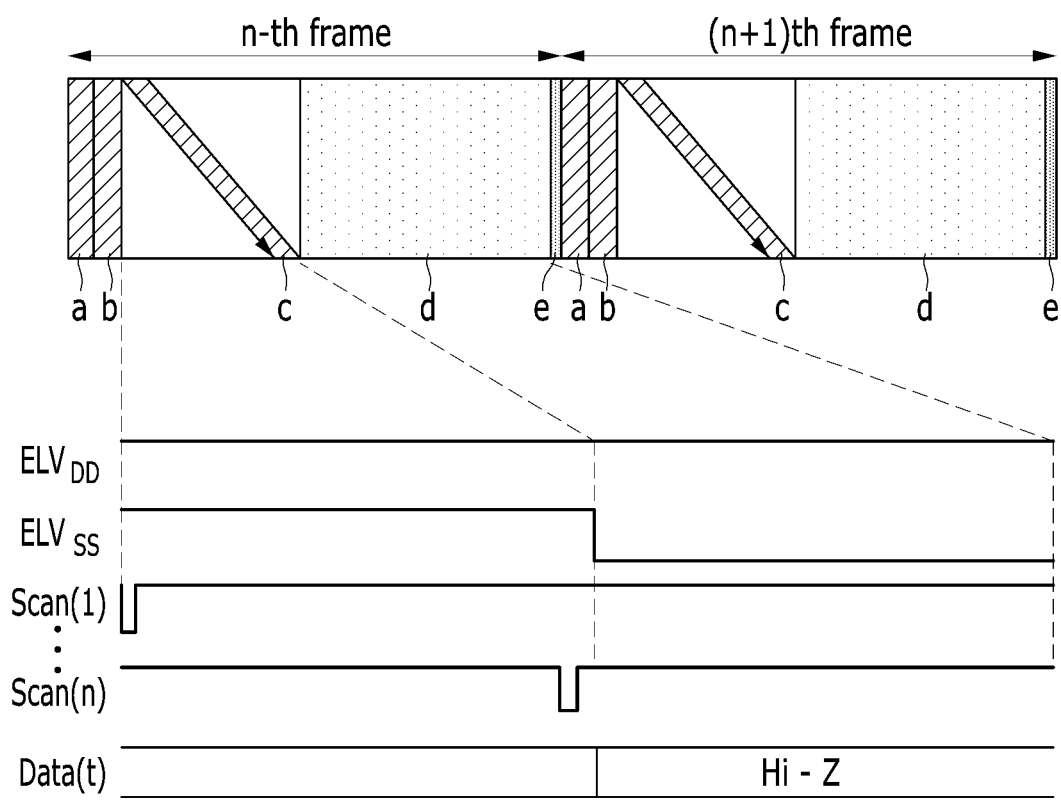
FIG. 4 shows a driving timing diagram of an organic light emitting diode (OLED) display according to an exemplary embodiment.

Referring to FIG. 4, a period of one frame of the SEAV method includes a scan period in which a plurality of data signals are transmitted and programmed to all pixels, and a light emitting period in which all pixels emit light according to the programmed data signals after the data signals are programmed to all pixels. That is, regarding the conventional sequential light emitting method, the data signals are sequentially input to the respective scan lines and light emission is sequentially performed. Whereas, regarding the simultaneous emission driving method, the data signals are sequentially input and light emission is performed as a batch after all the data signals are input.

In further detail, the driving method of this embodiment includes (a) resetting a driving voltage of the OLED in the pixel 10, (b) compensating a threshold voltage of the driving transistor (Qd) of the OLED, (c) transmitting data signals to the pixels 10 of the display device, and (d) controlling the OLEDs of the pixels 10 of the OLED display to simultaneously emit light corresponding to the transmitted data signals.

The stage (c) is sequentially performed for the respective scan lines, and the stages (a), (b), and (d) are each simultaneously performed for all pixels, as shown. In the stage (c), a plurality of scan signals (Scan[1]-Scan[n]) are sequentially input to the respective scan lines, and a plurality of data signals are sequentially input to the respective pixels 10. The stage (d) starts when the second power (ELVss) changes from high (e.g., 12V) to low (e.g., 0V). In this instance, when there is no shield capacitor, coupling occurs because of parasitic capacitance between the cathode 210 and the first electrodes 150 and 170. When the coupling occurs, a voltage at a second node N2, which is the gate node of the driving transistor (Qd) changes. Hence, the top and bottom of the panel near the power supply is bright and the center thereof is dark in a large panel such as a 40-inch OLED display, and long range uniformity may be deteriorated.

When the first to third transistors Q1, Q2, and Q3 configuring the pixel circuit 12 are realized with the n-channel type transistors, the waveform of the signals shown in FIG. 4 is inverted so no illustration and description on the waveform will be provided.

Figure 5:
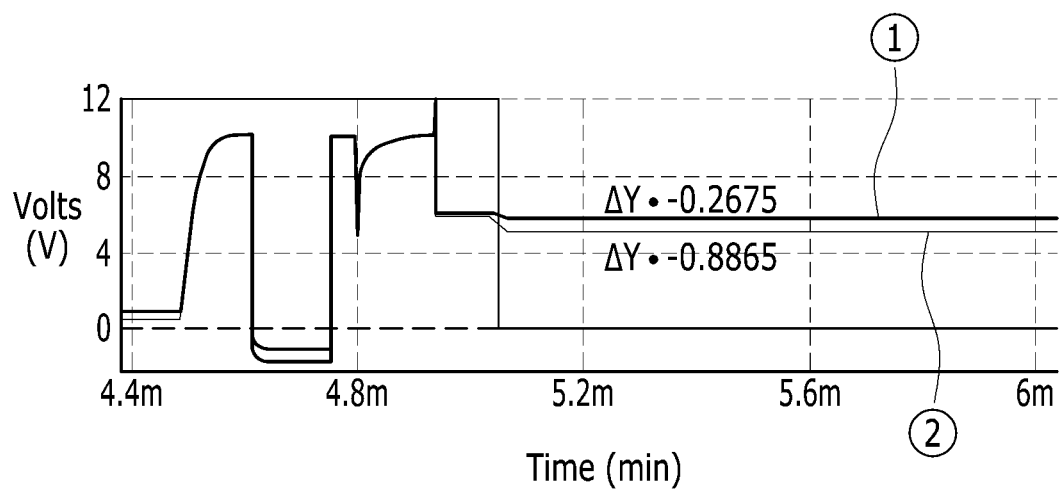
FIG. 5 shows a simulation timing diagram of an organic light emitting diode (OLED) display according to an exemplary embodiment.

When the second capacitor C2, which is a shield capacitor, is formed, voltage variation at the second node N2 is effectively reduced. As shown by the simulation timing diagram of FIG. 5, a coupling voltage when there is no shield capacitor C2 is about 0.89V and the coupling voltage when the shield capacitor is used C2 is about 0.27V. That is, the coupling voltage when the shield capacitor C2 is used is reduced to be less than ⅓ the coupling voltage when the shield capacitor C2 is not used. Therefore, the long range uniformity of the OLED display is improved by using the second capacitor C2, which is a shield capacitor, for shielding parasitic capacitance between the cathode 210, the gate 150, and the conductive layer pattern 170 contacting the gate 150.

Figure 6:
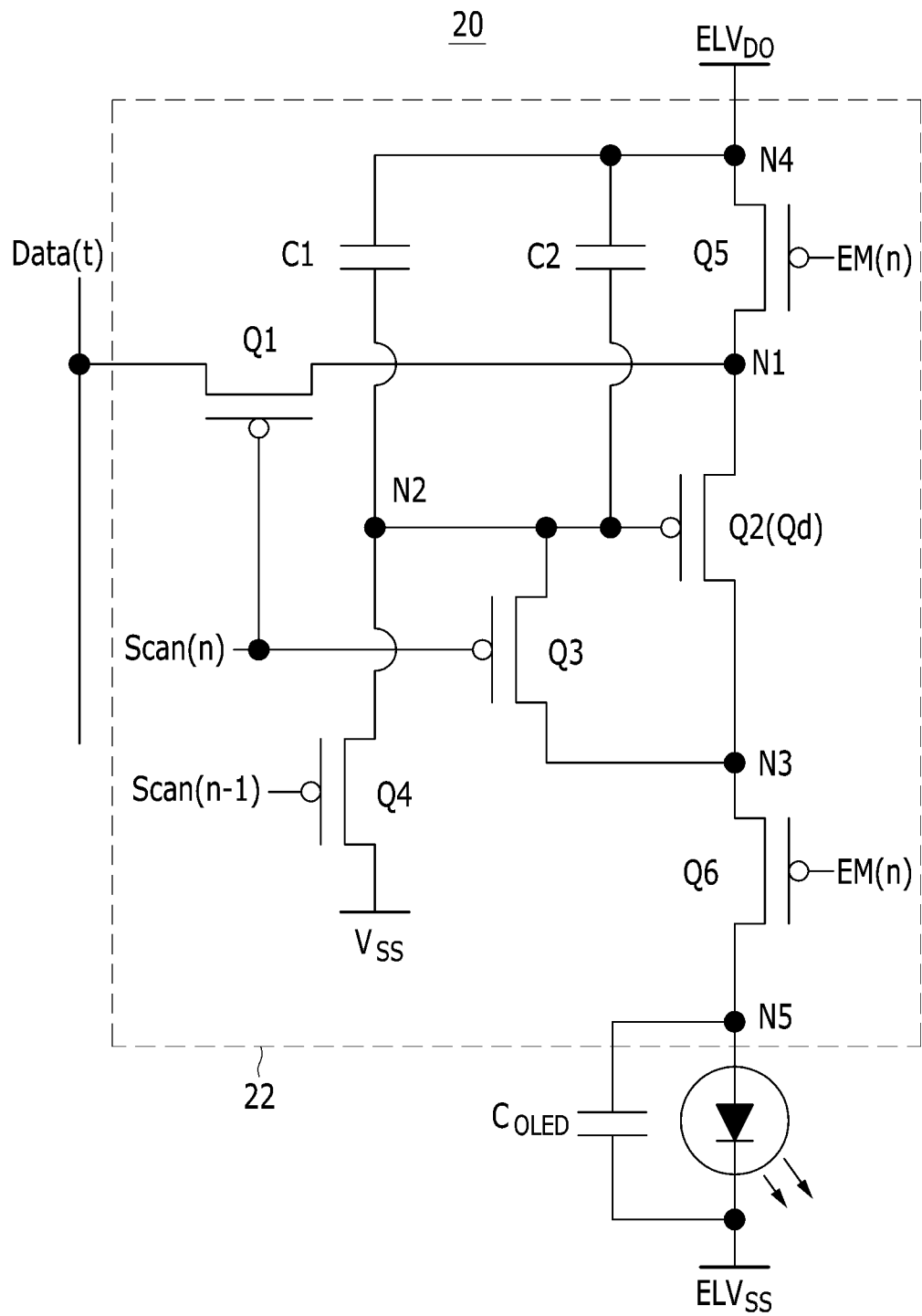
FIG. 6 shows an equivalent circuit of an organic light emitting diode (OLED) display pixel according to an another exemplary embodiment.

FIG. 6 shows an equivalent circuit of an OLED display pixel according to another exemplary embodiment. Referring to FIG. 6, each pixel 20 includes an OLED and a 6T2C-structured pixel circuit 22.

A gate of the first transistor Q1 is connected to the current scan signal (scan[n]). An input terminal of the first transistor Q1 is connected to the data signal (Data[t]). An output terminal of the first transistor Q1 is connected to the first node N1.

A gate of the driving transistor (Qd), which is the second transistor Q2, is connected to the first capacitor C1 and the second capacitor C2 at the second node N2. An input terminal of the driving transistor (Qd) is connected to the output terminal of the fifth transistor Q5 and the output terminal of the first transistor Q1 at the first node N1. An output terminal of the driving transistor (Qd) is connected to the input terminal of the third transistor Q3 and the input terminal of the sixth transistor Q6 at the third node N3.

A gate of the third transistor Q3 is connected to the current scan signal (scan[n]). An input terminal of the third transistor Q3 is connected to the output terminal of the driving transistor (Qd) at the third node N3. An output terminal of the third transistor Q3 is connected to the gate of the driving transistor (Qd), the first and second capacitors C1 and C2, and an input terminal of the fourth transistor Q4 at the second node N2.

A gate of the fourth transistor Q4 is connected to the previous scan signal (scan[n−1]). An input terminal of the fourth transistor Q4 is connected to the gate of the driving transistor (Qd), the first and second capacitors C1 and C2, and an output terminal of the third transistor Q3 at the second node N2. An initialization voltage (Vinti) is applied to the output terminal of the fourth transistor Q4.

A gate of the fifth transistor Q5 is connected to the current light emitting signal (Em[n]). An input terminal of the fifth transistor Q5 is connected to a first power, for example, a driving voltage (ELVdd) at the fourth node N4. An output terminal of the fifth transistor Q5 is connected to the output terminal of the first transistor Q1 and the input terminal of the driving transistor (Qd) at the first node N1.

A gate of the sixth transistor Q6 is connected to the current light emitting signal (em[n]). An input terminal of the sixth transistor Q6 is connected to the output terminal of the driving transistor (Qd) and the input terminal of the third transistor Q3 at the third node N3. An output terminal of the sixth transistor Q6 is connected to the first terminal of the OLED at the fifth node N5.

A first terminal of the first capacitor C1 is connected to the gate of the driving transistor (Qd), the output terminal of the third transistor Q3, the input terminal of the fourth transistor Q4, and the first terminal of the second capacitor C2 at the second node N2. A second terminal of the first capacitor C1 is connected to the first power (ELVdd) at the fourth node N4.

A first terminal of the second capacitor C2 is connected to the gate of the driving transistor (Qd), the output terminal of the third transistor Q3, the input terminal of the fourth transistor Q4, and the first terminal of the first capacitor C1 at the second node N2. A second terminal of the second capacitor C2 is connected to the first power (ELVdd) at the fourth node N4.

The anode (pixel electrode) of the OLED is connected to the output terminal of the sixth transistor Q6 at the fifth node N5. The cathode (common electrode) of the OLED is connected to the second power (ELVss).

The first to sixth transistors (Q1 to Q6) can be p-channel field effect transistors (PMOS). Thin film transistors (TFTs) are usable for the field effect transistors. The channel type of the first to sixth transistors (Q1 to Q6) may alternatively be n-channel, and in this case, the waveform of the signals for driving them can be inverted.

The first transistor Q1 is a switching transistor for transmitting a data signal (Data[t]) of a voltage level applied to the corresponding data line in response to the scan signal (scan[n]). The driving transistor (Qd), which is the second transistor Q2, supplies a driving current of the OLED corresponding to the data signal (Data[t]) of the voltage level applied to the gate through the first transistor Q1. The third transistor Q3 compensates the threshold voltage of the driving transistor (Qd) in response to the current scan signal (scan[n]). The fourth transistor Q4 initializes the data signal stored in the first and second capacitors C1 and C2 in response to the previous scan signal (scan[n−1]). The fifth transistor Q5 supplies a first power, for example, a driving voltage (ELVdd) to the driving transistor (Qd) in response to the current light emitting signal (Em[n]). The sixth transistor Q6 supplies a driving current, which is an output current of the driving transistor (Qd), to the OLED in response to the current light emitting signal (em[n]).

The first capacitor C1 stores the data signal applied to the gate of the driving transistor (Qd). The second capacitor C2 is a shield capacitor for preventing the coupling caused by the parasitic capacitance may be formed between the gate electrode of the driving transistor (Qd) and the cathode to which the second power (ELVss) is applied.

FIG. 6 shows the 6T2C with the pixel circuit 22, and in some embodiments, the third to sixth transistors (Q3-Q6) are omitted or exchanged with other transistor configurations.

Figure 7:
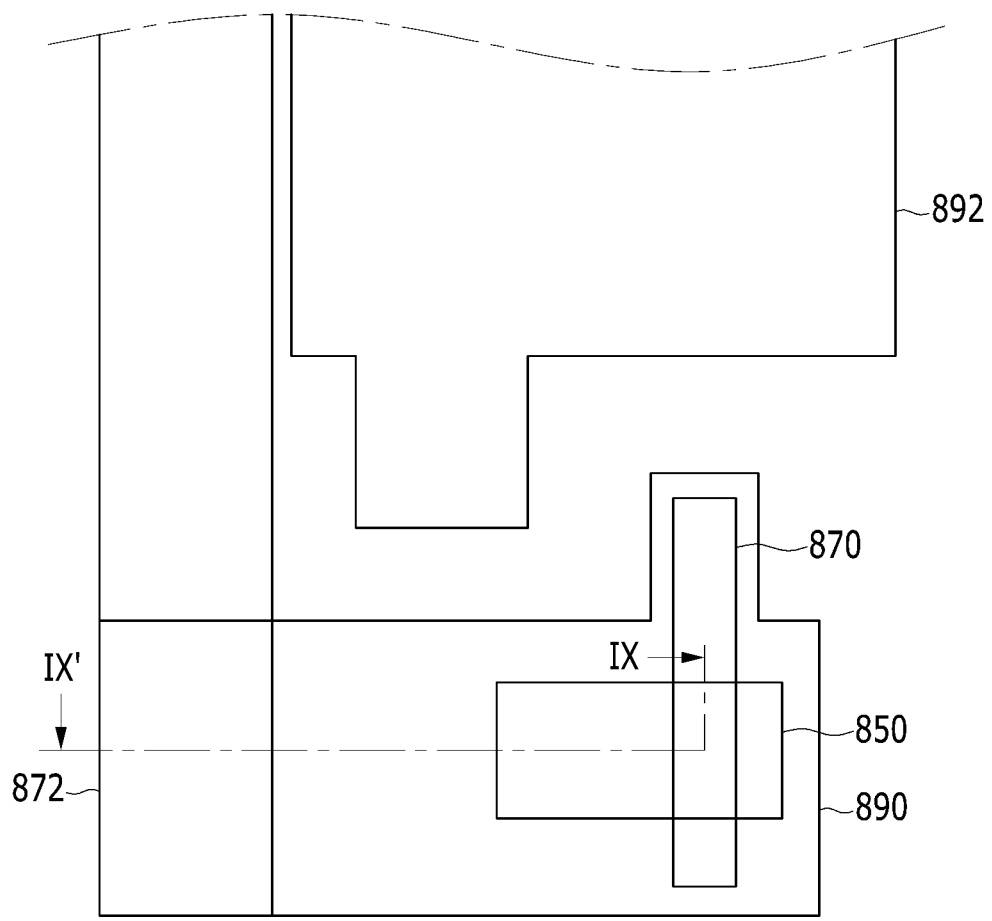
FIG. 7 shows a layout of an organic light emitting diode (OLED) display pixel according to another exemplary embodiment.
Figure 8:
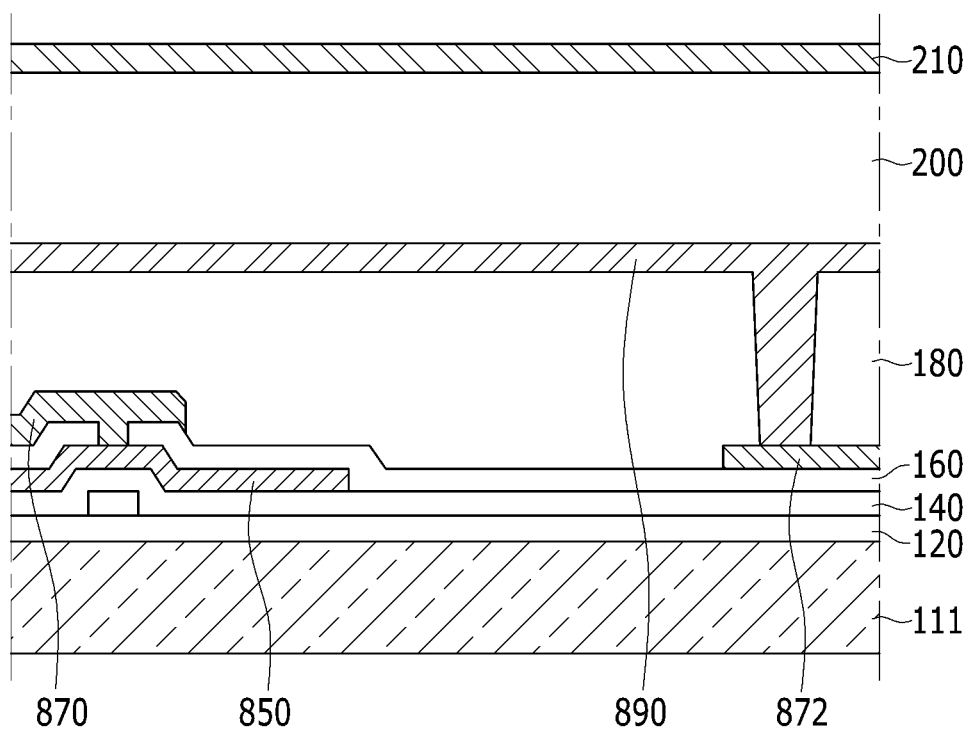
FIG. 8 shows a cross-sectional view of an organic light emitting diode (OLED) display pixel according to another exemplary embodiment.

FIG. 7 and FIG. 8 respectively show a layout and a cross-sectional view of an OLED display pixel according to another exemplary embodiment. In a like manner of FIG. 2, FIG. 7 shows a layout of elements that form the first electrode of the second capacitor C2, which is a shield capacitor, for example, a gate electrode 850 and a conductive layer pattern 870 contacting the gate electrode 850 and elements that form the second electrode, for example, a conductive layer pattern 890 formed on the same layer as an anode 892 and the first power (ELVdd) line 872. The conductive layer pattern 870 connects the gate electrode 850 of the second transistor Q2 to the active patterns of the third transistor Q3 and the fourth transistor Q4. The stacked order and the respective functions of the constituent elements are similar to those of the OLED display described with reference to FIG. 2 and FIG. 3 except the layout. Therefore, substantially equivalent constituent elements using the same reference numerals will not generally be described.

As shown in FIG. 7 and FIG. 8, the second electrode 890 of the second capacitor C2, which is a shield capacitor, is formed to cover the first electrodes 850 and 870 comprising the gate electrode 850 of the driving transistor (Qd) and the conductive layer pattern 870 being configured for contacting the gate electrode 850. Therefore, parasitic capacitance between the cathode 210 and the first electrodes 850 and 870 is shielded.

Although not shown, the effect of the function of the shield capacitor of the OLED display according to the exemplary embodiment described with reference to FIG. 6 through FIG. 8 can be maximized by using the simultaneous emission with active voltage (SEAV) driving method.

The drawings and the detailed description described above are examples and are provided to explain various aspects and features, and the scope of the present invention is not limited thereto. For example, a shield capacitor according to exemplary embodiments can be realized in various layouts and stack structures of the OLED display to which the simultaneous emission with active voltage method is applied.

While various features and aspects have been described in connection with what is presently considered to be practical exemplary embodiments, it is to be understood that the invention is not limited to the disclosed embodiments, but, on the contrary, is intended to cover various modifications and equivalent arrangements.

What is claimed is:

1. A method for manufacturing an organic light emitting diode (OLED) display, the method comprising:
   forming a first active pattern on a substrate;
   forming a gate insulating layer;
   forming a gate electrode overlapping at least a part of the first active pattern on the gate insulating layer;
   forming an interlayer insulating layer;
   forming a conductive layer pattern and an anode of an OLED, the conductive layer pattern covering the gate electrode and contacting a first power line on the interlayer insulating layer, the conductive layer being a second electrode of a shield capacitor with a first electrode including the gate electrode;
   forming a pixel defining layer; and
   forming the OLED by forming an organic emission layer and a cathode.

2. The method of claim 1, wherein the conductive layer pattern is formed to entirely cover the first electrode.

3. The method of claim 2, wherein the forming of an interlayer insulating layer includes:
   forming a first interlayer insulating layer;
   forming a conductive layer pattern contacting the gate electrode and the first power line; and
   forming a second interlayer insulating layer,
   wherein the conductive layer pattern contacting the first power line is formed to entirely cover the first electrode including the gate electrode and the conductive layer pattern contacting the gate electrode.

4. The method of claim 1, wherein the gate electrode is a gate electrode of a driving transistor for supplying a driving current of the OLED corresponding to an input data signal.

* * * * *